(12) United States Patent
Zuo et al.

(10) Patent No.: US 11,387,182 B2
(45) Date of Patent: Jul. 12, 2022

(54) MODULE STRUCTURE AND METHOD FOR MANUFACTURING THE MODULE STRUCTURE

(71) Applicant: ANHUI ANUKI TECHNOLOGIES CO., LTD., Anhui (CN)

(72) Inventors: Chengjie Zuo, Anhui (CN); Jun He, Anhui (CN)

(73) Assignee: ANHUI ANUKI TECHNOLOGIES CO., LTD., Anhui (CN)

(*) Notice: Subject to any disclaimer, the term of this patent is extended or adjusted under 35 U.S.C. 154(b) by 86 days.

(21) Appl. No.: 16/965,909

(22) PCT Filed: Jul. 9, 2018

(86) PCT No.: PCT/CN2018/095017
§ 371 (c)(1),
(2) Date: Jul. 29, 2020

(87) PCT Pub. No.: WO2019/144574
PCT Pub. Date: Aug. 1, 2019

(65) Prior Publication Data
US 2021/0074634 A1    Mar. 11, 2021

(30) Foreign Application Priority Data

Jan. 29, 2018 (CN) .......................... 201810085331.8
Jan. 29, 2018 (CN) .......................... 201820147790.X

(51) Int. Cl.
*H01L 23/522* (2006.01)
*H01L 25/16* (2006.01)
*H01F 5/00* (2006.01)

(52) U.S. Cl.
CPC ...... *H01L 23/5227* (2013.01); *H01L 23/5223* (2013.01); *H01L 23/5226* (2013.01); *H01L 25/16* (2013.01)

(58) Field of Classification Search
CPC ......... H01L 24/09; H01L 24/20; H01L 24/19; H01L 24/18; H01L 24/25; H01L 24/33;
(Continued)

(56) References Cited

U.S. PATENT DOCUMENTS

| 7,724,117 B2 * | 5/2010 | Goyette | H05K 1/165 336/200 |
| 10,778,261 B2 * | 9/2020 | McIntyre | H04B 1/0057 |

(Continued)

FOREIGN PATENT DOCUMENTS

| CN | 106887393 | 6/2017 |
| CN | 108133931 | 6/2018 |

(Continued)

OTHER PUBLICATIONS

International Search Report, PCT/CN2018/095017, dated Oct. 26, 2018.

*Primary Examiner* — Mary A Wilczewski
*Assistant Examiner* — Tsz K Chiu
(74) *Attorney, Agent, or Firm* — Greenberg Traurig

(57) ABSTRACT

The module structure includes a substrate, a passive element, metal columns and a chip. The passive element, the metal columns and the chip are located on a same side of the substrate. The passive element is located between the substrate and the film where the metal columns and the chip are located. The following applies: the vertical projection of the chip on the substrate overlaps a line segment or closed figure formed by endpoints constituted by the vertical projections of the metal columns on the substrate; the vertical projection of the passive element on the substrate overlaps the line segment or closed figure formed by the endpoints constituted by the vertical projections of the metal columns on the substrate; or the vertical projection of the passive element on the substrate overlaps the vertical projection of the chip on the substrate.

8 Claims, 6 Drawing Sheets

(58) Field of Classification Search
CPC . H01L 24/49; H01L 2224/97; H01L 2224/96; H01L 2224/2205; H01L 2224/2105; H01L 2224/214; H01L 2224/224; H01L 2224/2541; H01L 28/20–26; H01L 28/40–92; H01L 23/5227; H01L 23/5223; H01L 23/5226; H01L 23/49811; H01L 23/49822; H01L 23/5389
See application file for complete search history.

(56) References Cited

U.S. PATENT DOCUMENTS

| | | | | |
|---|---|---|---|---|
| 2009/0322461 | A1* | 12/2009 | Hebert | H01F 17/0033 336/83 |
| 2010/0090752 | A1* | 4/2010 | Kim | G06K 19/07749 327/530 |
| 2013/0027127 | A1* | 1/2013 | Topaloglu | H01L 23/66 327/564 |
| 2016/0372446 | A1 | 12/2016 | Keser et al. | |
| 2019/0320531 | A1* | 10/2019 | Yasuda | H05K 1/181 |

FOREIGN PATENT DOCUMENTS

| | | | | |
|---|---|---|---|---|
| JP | 2004056093 | | 2/2004 | |
| JP | 2006216768 | | 8/2006 | |
| JP | 2006286690 | | 10/2006 | |
| JP | 2009099752 | | 5/2009 | |
| WO | WO-2009050974 | A1 * | 4/2009 | ......... H01L 21/4807 |
| WO | WO-2012129822 | A1 * | 10/2012 | ......... H01L 21/4828 |
| WO | WO-2018171100 | A1 * | 9/2018 | |

* cited by examiner

MODULE STRUCTURE AND METHOD FOR MANUFACTURING THE MODULE STRUCTURE

CROSS-REFERENCE TO RELATED APPLICATIONS

The present application is a national stage application under 35 U.S.C. 371 of International Patent Application No. PCT/CN2018/095017, filed on Jul. 9, 2018, which claims priority to Chinese Patent Application No. 201810085331.8 filed with the CNIPA on Jan. 29, 2018 and Chinese Patent Application No. 201820147790.X filed with the CNIPA on Jan. 29, 2018, the disclosures of which are incorporated herein by reference in their entireties.

TECHNICAL FIELD

Embodiments of the present application relate to the technology of integrated circuit modules, and for example, to a module structure and a method for manufacturing the module structure.

BACKGROUND

With the increasing development of electronic products, various components are growing towards high integration and multiple functions in terms of research and development. Therefore, the requirements for integrated circuit module structures in which the components are integrated are increasing.

An integrated circuit module structure contains various components, for example, chips such as a power amplifier, a low-noise amplifier, a switch and an acoustic wave filter and passive elements such as capacitors and inductors. Generally, all these components are laid flat on the substrate of the module structure. The arrangement of the flat-laid components on the substrate of the module structure results in an increase of the area of the module structure, so that the space utilization of the integrated circuit module structure is relatively low, which is not conducive to the high integration of the integrated circuit module structure.

SUMMARY

The present application provides a module structure and a method for manufacturing the module structure so that the flat-laid area of the module structure is reduced, the space utilization of the module structure is improved, and the high integration of the module structure is achieved.

The present application provides a module structure. The module structure includes a substrate, at least one passive element, at least two metal columns and at least one chip.

The at least one passive element, the at least two metal columns and the at least one chip are located on the same side of the substrate. The at least one passive element is located between the substrate and the film where the at least two metal columns are located and between the substrate and the film where the at least one chip is located.

The vertical projection of the at least one chip on the substrate overlaps a line segment or closed figure formed by endpoints constituted by the vertical projections of the at least two metal columns on the substrate.

Moreover, at least one of the following applies: a vertical projection of the at least one passive element on the substrate overlaps the line segment or closed figure formed by endpoints constituted by the vertical projections of the at least two metal columns on the substrate; or a vertical projection of the at least one passive element on the substrate overlaps the vertical projection of the at least one chip on the substrate.

In an embodiment, an individual metal column of the at least two metal columns forms an inductor or at least part of the at least two metal columns are electrically connected to each other to form an inductor coil.

In an embodiment, the module structure further includes a first dielectric layer, a second dielectric layer and a third dielectric layer.

The first dielectric layer covers or wraps the at least one passive element.

The second dielectric layer is located on a side of the first dielectric layer away from the substrate.

The third dielectric layer is located on a side of the second dielectric layer away from the substrate and covers the second dielectric layer.

In an embodiment, the at least one passive element includes at least one of a capacitor, a resistor or an inductor.

In an embodiment, the module structure further includes a first connection layer and a second connection layer.

The first connection layer is located on the side of the first dielectric layer away from the substrate.

The second connection layer is located on the side of the second dielectric layer away from the substrate.

In an embodiment, a first via is formed in the first dielectric layer, a first conductor is formed in the first via, and the at least one passive element is electrically connected to at least one of the at least two metal columns or the at least one chip through the first conductor and the first connection layer.

A second via is formed in the second dielectric layer, a second conductor is formed in the second via, and the at least two metal columns are electrically connected to the at least one chip through the second conductor and the second connection layer.

In an embodiment, an each of the at least one chip includes at least one interface, and each of the at least one interface is located on a surface of a respective chip adjacent to the substrate or a surface of the respective chip away from the substrate.

In an embodiment, in the case where each of the at least one interface is located on the surface of the respective chip away from the substrate, the module structure further includes a support layer.

The support layer is located between the respective chip and the substrate.

In an embodiment, a surface of the second dielectric layer away from the substrate is flush with surfaces of the at least two metal columns away from the substrate.

In an embodiment, a surface of the second dielectric layer away from the substrate is lower than or higher than surfaces of the at least two metal columns away from the substrate.

The present application further provides a method for manufacturing a module structure. The method includes the steps described below.

A substrate is provided.

At least one passive element is disposed on the substrate.

At least two metal columns and at least one chip are disposed on a side of the at least one passive element away from the substrate.

The vertical projection of the at least one chip on the substrate overlaps a line segment or closed figure formed by endpoints constituted by the vertical projections of the at least two metal columns on the substrate.

Moreover, at least one of the following applies: the vertical projection of the at least one passive element on the substrate overlaps the line segment or closed figure formed by the endpoints constituted by the vertical projections of the at least two metal columns on the substrate; or the vertical projection of the at least one passive element on the substrate overlaps the vertical projection of the at least one chip on the substrate.

In an embodiment, the step in which the at least two metal columns and the at least one chip are disposed on the side of the at least one passive element away from the substrate includes the steps described below.

A first dielectric layer is formed on aside of the substrate adjacent to the at least one passive element, the first dielectric layer covers or wraps the at least one passive element, a first via is formed in the first dielectric layer, and a first conductor is formed in the first via.

The at least two metal columns and the at least one chip are disposed on a side of the first dielectric layer away from the at least one passive element.

The present application provides a module structure and a method for manufacturing the module structure. At least one passive element is disposed between a substrate and the film where at least one chip and at least two metal columns are located so that the at least one passive element and other elements are stacked three-dimensionally and not laid flat and thus the area of the module structure is reduced. Moreover, the at least one chip is disposed among the at least two metal columns in such manner that the at least one chip is nested among the at least two metal columns so that the space utilization of the module structure is improved and the high integration of the module structure is achieved.

DETAILED DESCRIPTION

Figure 1:
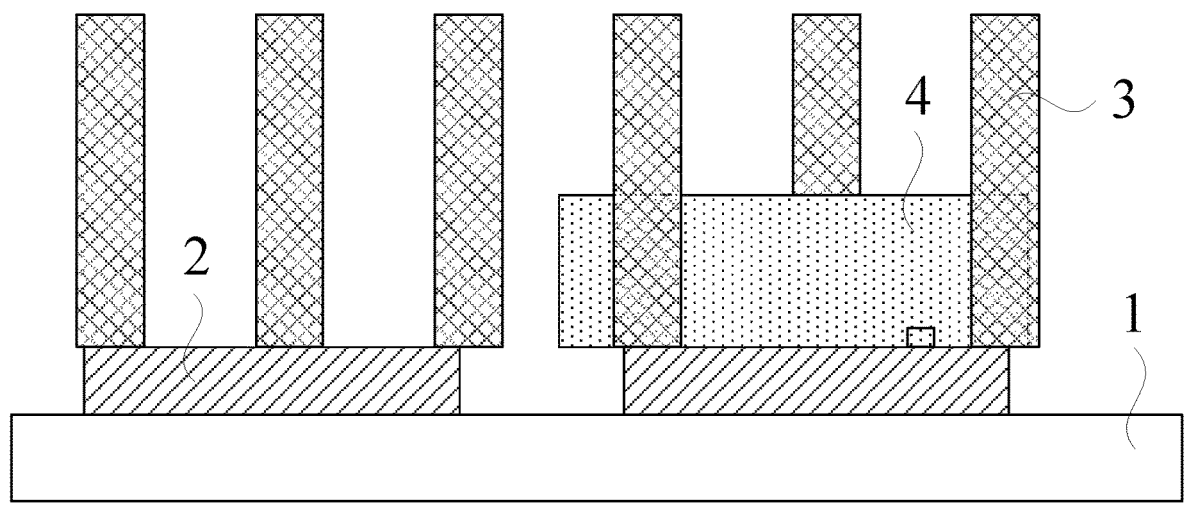
FIG. 1 is a structure diagram of a module structure according to embodiment one.

The present application is further described below in conjunction with drawings and embodiments. The embodiments described herein are intended to explain and not to limit the present application. For ease of description, only part, not all, of structures related to the present application are illustrated in the drawings.

Embodiment One

FIG. 1 is a structure diagram of a module structure according to embodiment one. Referring to FIG. 1, the module structure includes a substrate 1, at least one passive element 2, at least two metal columns 3 and at least one chip 4. The at least one passive element 2, the at least two metal columns 3 and the at least one chip 4 are located on the same side of the substrate 1. The at least one passive element 2 is located between the substrate 1 and the film where the at least two metal columns 3 are located and between the substrate 1 and the film where the at least one chip 4 is located. The vertical projection of the at least one chip 4 on the substrate 1 overlaps a line segment or closed figure formed by endpoints constituted by the vertical projections of the at least two metal columns 3 on the substrate 1. Moreover, at least one of the following applies: the vertical projection of the at least one passive element 2 on the substrate 1 overlaps the line segment or closed figure formed by the endpoints constituted by the vertical projections of the at least two metal columns 3 on the substrate 1, or the vertical projection of the at least one passive element 2 on the substrate 1 overlaps the vertical projection of the at least one chip 4 on the substrate 1.

In FIG. 1, the vertical projection of the at least one passive element 2 on the substrate 1 overlaps both the line segment or closed figure formed by the endpoints constituted by the vertical projections of the at least two metal columns 3 on the substrate 1 and the vertical projection of the at least one chip 4 on the substrate 1 just by way of example and not by way of limitation. Moreover, the vertical projection of the at least one passive element 2 on the substrate 1 may overlap only the line segment or closed figure formed by the endpoints constituted by the vertical projections of the at least two metal columns 3 on the substrate 1 or may overlap only the vertical projection of the at least one chip 4 on the substrate 1.

The at least one passive element 2 is located between the substrate 1 and the film where the at least two metal columns 3 and the at least one chip 4 are located, and at least one of the following applies: the vertical projection of the at least one passive element 2 on the substrate 1 overlaps the line segment or closed figure formed by the endpoints constituted by the vertical projections of the at least two metal columns 3 on the substrate 1, or the vertical projection of the at least one passive element 2 on the substrate 1 overlaps the vertical projection of the at least one chip 4 on the substrate 1. In this manner, the at least one passive element 2 and elements such as the at least two metal columns 3 and the at least one chip 4 are stacked three-dimensionally and not laid flat on the substrate 1 and thus the space reuse is achieved and the flat-laid area of the constituted module structure is reduced.

The at least two metal columns 3 and the at least one chip 4 are located in the same film. The vertical projection of the at least one chip 4 on the substrate 1 overlaps the line segment or closed figure formed by the endpoints constituted by the vertical projections of the at least two metal columns 3 on the substrate 1, that is, the at least one chip 4 is nested among the at least two metal columns 3. The at least one chip 4 is disposed among the at least two metal columns 3 so that the space utilization is improved and the flat-laid area of the module structure is reduced.

The substrate in the module structure may be a structure such as a silicon chip, a glass wafer, a substrate layer or a panel. In the case where the module structure includes multiple chips 4, the multiple chips 4 may be the same or different. The different chips may be, for example, a power amplifier, a low-noise amplifier, a switch and an acoustic wave filter. Likewise, in the case where the module structure includes multiple passive elements 2, the multiple passive elements 2 may be the same or different. Optionally, the passive elements 2 may include at least one of a capacitor, a resistor or an inductor.

In an embodiment, for purposes of reducing the area of the module structure and enabling the space utilization of the module structure to be higher while guaranteeing the normal operation of the module structure, other elements in the module structure are stacked three-dimensionally or nested through a reasonable design. Exemplarily, the element other than the at least one chip 4 (such as a capacitor) is nested among the at least two metal columns 3, that is, the capacitor and the at least two metal columns 3 are located in the same film and the vertical projection of the capacitor on the substrate 1 overlaps the line segment or closed figure formed by the endpoints constituted by the vertical projections of the at least two metal columns 3 on the substrate 1. In view of the height difference existing between the at least one chip 4 and the at least two metal columns 3, other elements may be located in the space between the height difference of the at least one chip 4 and the at least two metal columns 3 while the at least one chip 4 is nested among the at least two metal columns 3.

In the module structure provided by embodiment one of the present application, at least one passive element is disposed between a substrate and the film where at least one chip and at least two metal columns are located so that the at least one passive element and other elements are stacked three-dimensionally and not laid flat and thus the area of the module structure is reduced. Moreover, the at least one chip is disposed among the at least two metal columns in such manner that the at least one chip is nested among the at least two metal columns, so that the space utilization of the module structure is improved and the high integration of the module structure is achieved.

Figure 2:
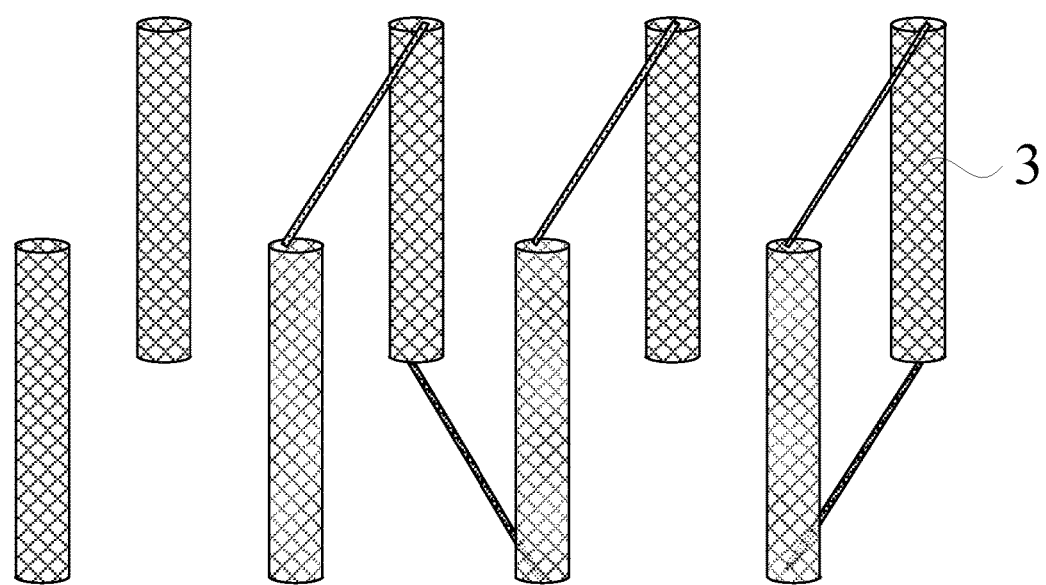
FIG. 2 is a structure diagram illustrating connection among metal columns according to embodiment one.

The at least two metal columns 3 can achieve different functions through different connection manners and the connection manners of the at least two metal columns 3 may be determined according to the actual requirements. FIG. 2 is a structure diagram illustrating connection among metal columns according to embodiment one. Referring to FIG. 2, optionally, an individual metal column 3 forms an inductor or at least part of the at least two metal columns 3 are electrically connected to each other to form an inductor coil.

In the actual application, the at least two metal columns 3 may not be connected to each other and the individual metal column 3 may be used as an inductance element or a resistor or may be used as a connection wire. Alternatively, multiple metal columns 3 may be connected to each other to form an inductor coil, thereby facilitating the achievement of the particular function of the inductor coil. Exemplarily, in the case where the multiple metal columns 3 are connected to each other, an inductor coil with a spiral structure may be formed or multiple coils each with a closed structure may be formed according to the actual requirements. It is to be understood that according to the connection requirement of the actual circuit, the metal columns 3 may be electrically connected to other elements such as the at least one chip 4 and the at least one passive element 2.

Figure 3:
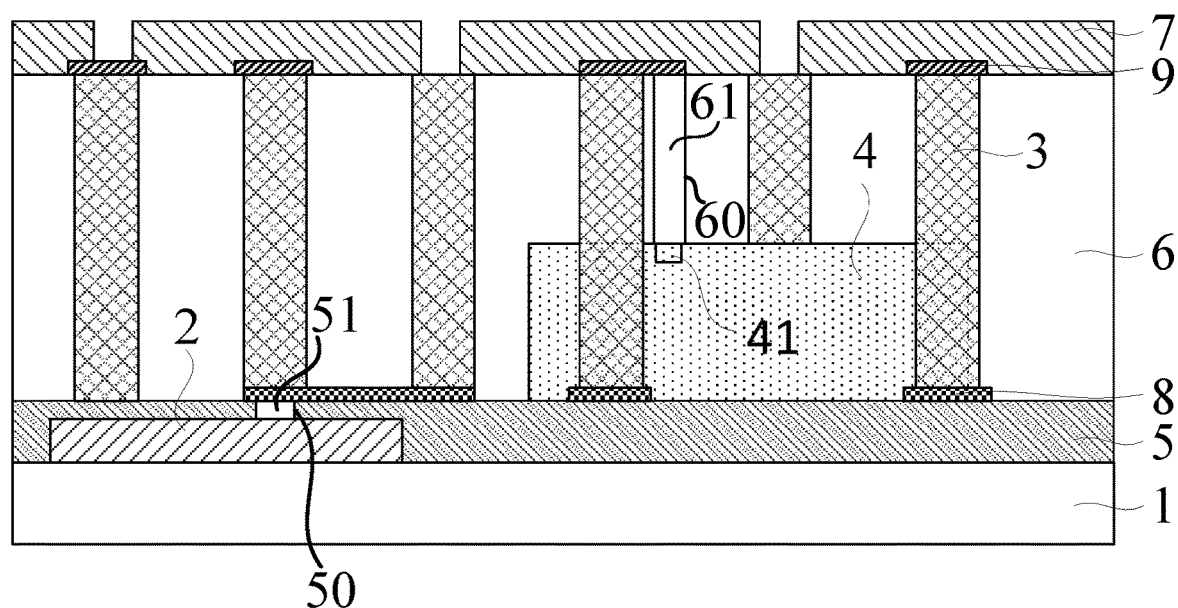
FIG. 3 is a structure diagram of another module structure according to embodiment one.

To guarantee that the short circuit or leakage of the circuit in the module structure does not occur due to the three-dimensional stack or the nested stack of multiple elements, a dielectric layer may be disposed in the module structure so that the multiple elements may be electrically insulated from each other. FIG. 3 is a structure diagram of another module structure according to embodiment one. Exemplarily, referring to FIG. 3, the module structure further includes a first dielectric layer 5, a second dielectric layer 6 and a third dielectric layer 7. The first dielectric layer 5 covers or wraps the at least one passive element 2. The second dielectric layer 6 is located on a side of the first dielectric layer 5 away from the substrate 1 and the surface of the second dielectric layer 6 away from the substrate 1 is flush with surfaces of the at least two metal columns 3 away from the substrate 1. The third dielectric layer 7 is located on a side of the second dielectric layer 6 away from the substrate 1 and the third dielectric layer 7 covers the second dielectric layer 6.

The first dielectric layer 5, the second dielectric layer 6 and the third dielectric layer 7 may be made of the same dielectric material or may be made of different dielectric materials. The first dielectric layer 5, the second dielectric layer 6 and the third dielectric layer 7 may prevent the short circuit of the circuit in the module structure from occurring and does not affect the normal operation of the module structure.

In the case where other elements exist between the substrate 1 and the film where the at least two metal columns 3 and the at least one chip 4 are located, the first dielectric layer 5 may cover or wrap the other elements described above, that is, the first dielectric layer 5 may cover or wrap the elements located between the substrate 1 and the film where the at least two metal columns 3 and the at least one chip 4 are located. Moreover, the first dielectric layer 5 may also support the at least two metal columns 3 and the at least one chip 4 other than performing insulation so that the at least two metal columns 3 and the at least one chip 4 may be disposed on a side of elements such as the at least one passive element 2 away from the substrate 1, thereby facilitating the achievement of the three-dimensional stack of multiple elements.

The second dielectric layer 6 is used for achieving the electrical insulation among the at least two metal columns 3 and the at least one chip 4. In an embodiment, referring to FIG. 3, the surface of the second dielectric layer 6 away from the substrate 1 is flush with the surfaces of the at least two metal columns 3 away from the substrate 1 just by way of example and not by way of limitation. Optionally, the surface of the second dielectric layer 6 away from the substrate 1 may be higher than or lower than the surfaces of the at least two metal columns 3 away from the substrate 1.

In the case where the surface of the second dielectric layer 6 away from the substrate 1 is flush with the surfaces of the at least two metal columns 3 away from the substrate 1, a wire connecting the at least two metal columns 3 may be directly formed on the second dielectric layer 6 so that the electrical connection between the at least two metal columns 3 or between the metal column 3 and the chip 4 is achieved; in the case where the surface of the second dielectric layer 6 away from the substrate 1 is higher than the surfaces of the at least two metal columns 3 away from the substrate 1, a via needs to be formed in the second dielectric layer 6, a conductive material is filled in the via to form a conductor, and a wire is electrically connected to the conductive material in the via so that the electrical connection between the at least two metal columns 3 or between the metal column 3 and the chip 4 is achieved; and in the case where the surface of the second dielectric layer 6 away from the substrate 1 is lower than the surfaces of the at least two metal columns 3 away from the substrate 1, a wire connecting the at least two metal columns 3 is formed on the surface of the second dielectric layer 6 lower than the surfaces of the at least two metal columns 3 without the need for punching. Optionally, in this case, the thicknesses of the parts of the at least two metal columns 3 higher than the second dielectric layer 6 are equal to the thickness of the wire.

Generally, the thicknesses of the at least two metal columns 3 may be configured to be greater than the thickness of the at least one chip 4. However, the thicknesses of the at least two metal columns 3 and the thickness of the at least one chip 4 may be adjusted according to the actual condition. With continued reference to FIG. 3, optionally, the module structure further includes a first connection layer 8 located on a side of the first dielectric layer 5 away from the substrate 1 and a second connection layer 9 located on a side of the second dielectric layer 6 away from the substrate 1.

The first connection layer 8 and the second connection layer 9 may be metal structures. It is to be understood that the first connection layer 8 and the second connection layer 9 may be metal patterns formed according to the preset connection path of multiple elements, and the electrical connection among the multiple elements is achieved through the first connection layer 9 and the second connection layer 9 so that solder balls are prevented from being formed on the at least two metal columns 3 and the at least one passive element 2 during the connection process, the parasitic resistance in the module structure is reduced, and the quality factor of the capacitor and the inductor in the module structure can be improved.

The first connection layer 8 may further include elements such as an inductor formed by part of the metal in the first connection layer 8 and the second connection layer 9 may further include elements such as an inductor formed by part of the metal in the second connection layer 9.

Moreover, in the case where at least part of the at least two metal columns 3 are electrically connected to each other, part of the at least two metal columns 3 may form an inductor coil through the first connection layer 8 and the second connection layer 9, which are electrically connected to the part of the at least two metal columns 3 respectively.

Generally, the electrical connection among multiple elements in the module structure is achieved through solder balls. In view of the module structure in the case of a radio frequency or a high frequency, the parasitic resistance in the solder balls affects the quality factor of the capacitor or the inductor in the module structure and affects the performance of the module structure. To reduce the parasitic resistance in the module structure and improve the quality factor of the capacitor and the inductor, a via is formed in the dielectric layers and a conductive material is filled in the via to connect multiple elements in different films in the module structure. The at least two metal columns 3 may also be located in vias in the second dielectric layer 6 so that the function of up-down connection is achieved.

Exemplarily, with continued reference to FIG. 3, a first via 50 is formed in the first dielectric layer 5, a first conductor 51 is formed in the first via 50, and the at least one passive element 2 is electrically connected to at least one of the at least two metal columns 3 or the at least one chip 4 through the first conductor 51 and the first connection layer 8; a second via 60 is formed in the second dielectric layer 6, a second conductor 61 is formed in the second via 60, and the at least two metal columns 3 are electrically connected to the at least one chip 4 through the second conductor 61 and the second connection layer 9.

In an embodiment, the first via 50 and the second via 60 are formed through operations such as etching and corrosion performed on the first dielectric layer 5 or the second dielectric layer 6 according to the actual requirements. The first conductor 51 filled in the first via 50 and the second conductor 61 filled in the second via 60 may be formed by a metal material with a good conductive property and high conductivity.

The first conductor 51 is located in the first via 50 in the first dielectric layer 5 and is used for achieving the electrical connection among the elements covered by the first dielectric layer 5 and the elements located in other films. That is, the first conductor 51 may achieve the electrical connection between the at least one passive element 2 and the at least two metal columns 3 or between the at least one passive element 2 and the at least one chip 4; and in the case where the first dielectric layer 5 covers other elements, the electrical connection between this element and the elements located on other films is achieved through the first conductor 51. Moreover, the first conductor 51 may be electrically connected to the first connection layer 8 according to the actual circuit design and the electrical connection among multiple elements is achieved through the cooperation between the first conductor 51 and the first connection layer 8. Exemplarily, in the case where more than one passive element 2 is covered or wrapped by the first dielectric layer 5, the electrical connection among the multiple passive elements 2 may be achieved through the first conductor 51 and the first connection layer 8.

Likewise, the second conductor 61 is used for achieving the electrical connection among the elements covered by the second dielectric layer 6 and the elements located on other films. The second conductor 61 may achieve the electrical connection between the metal column 3 and the chip 4 through the cooperation between the first connection layer 8 and the second connection layer 9. Exemplarily, the second conductor 61 may be disposed corresponding to the at least one chip 4 so that the electrical connection between the second conductor 61 and the at least one chip 4 is achieved. Moreover, the second conductor 61 and the second connection layer 9 is electrically connected, and the second connection layer 9 is electrically connected to the at least two metal columns 3, so that the electrical connection between the metal column 3 and the chip 4 is achieved.

Through the mutual cooperation between the first conductor 51, the second conductor 61, the first connection layer 8 and the second connection layer 9, the electrical connection among the elements located on multiple films is achieved so that solder balls are prevented from being formed, the parasitic resistance in the module structure is reduced, and the performance of the module structure is optimized.

In an embodiment, the first conductor 51 and the first connection layer 8 are formed through one deposition process and the second conductor 61 and the second connection layer 9 are formed through one deposition process.

In an embodiment, a third via may be formed in the third dielectric layer 7 and the third via may achieve the electrical connection between the module structure and other structures (such as other module structures or chips). To reduce the parasitic resistance, a third conductor may be formed in the third via.

Optionally, each of the at least one chip 4 includes at least one interface 41 and each of the at least one interface 41 is located on a surface of a respective chip 4 adjacent to the substrate 1 or a surface of a respective chip 4 away from the substrate 1.

The interface 41 in the chip 4 may be an I/O interface. In the case where at least one interface 41 is disposed in an individual chip, all the interfaces 41 may be disposed on the surface of the individual chip 4 adjacent to the substrate 1 or the surface of the individual chip 4 away from the substrate 1, or the at least one interface 41 may be disposed on the surface of the individual chip 4 adjacent to the substrate 1 and the surface of the individual chip 4 away from the substrate 1 respectively. For simplifying the actual circuit structure, the orientation of the at least one interface 41 of the individual chip 4 may be determined according to the structure connected to the at least one interface 41 of the individual chip 4.

Exemplarily, the at least one interface in the individual chip 4 may be configured to be located on a side of the individual chip 4 adjacent to the substrate 1. Exemplarily, in the manufacturing process, the first connection layer 8 is formed on the first dielectric layer 5 at first, the first connection layer 8 is provided with a metal interface, and the metal at the at least one interface of the individual chip 4 is directly pressed onto the metal interface so that the electrical connection between the at least one interface in the individual chip and the first connection layer is achieved.

Figure 4:
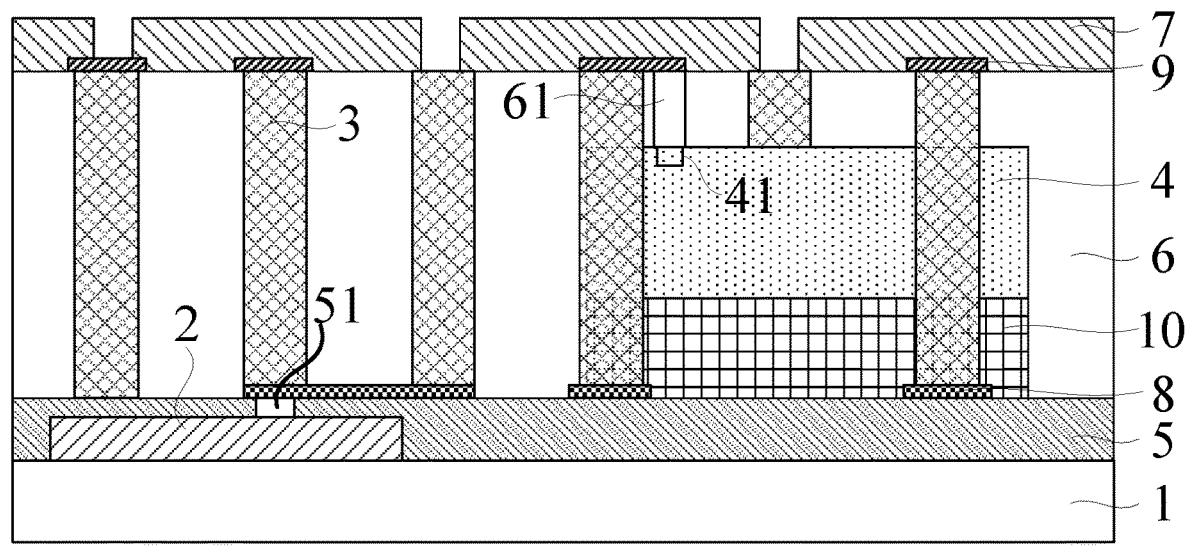
FIG. 4 is a structure diagram of another module structure according to embodiment one.

FIG. 4 is a structure diagram of another module structure according to embodiment one. Optionally, in the case where the interface 41 is located on the surface of the chip 4 away from the substrate 1, the module structure further includes a support layer 10. The support layer 10 is located between the chip 4 and the substrate 1 and is used for reducing the vertical distance between the interface and the end surfaces of the metal columns 3 away from the substrate 1.

Generally, the height difference exists between the at least one chip 4 and the at least two metal columns 3. To facilitate the electrical connection between the end surfaces of the at least two metal columns 3 away from the substrate 1 and the at least one interface 41, a support layer 10 may be disposed. The support layer 10 is merely used for reducing the height difference and no restriction is imposed on the material, shape or structure of the support layer 10 while the normal operation and performance of the module structure are not affected.

Embodiment Two

Figure 5:
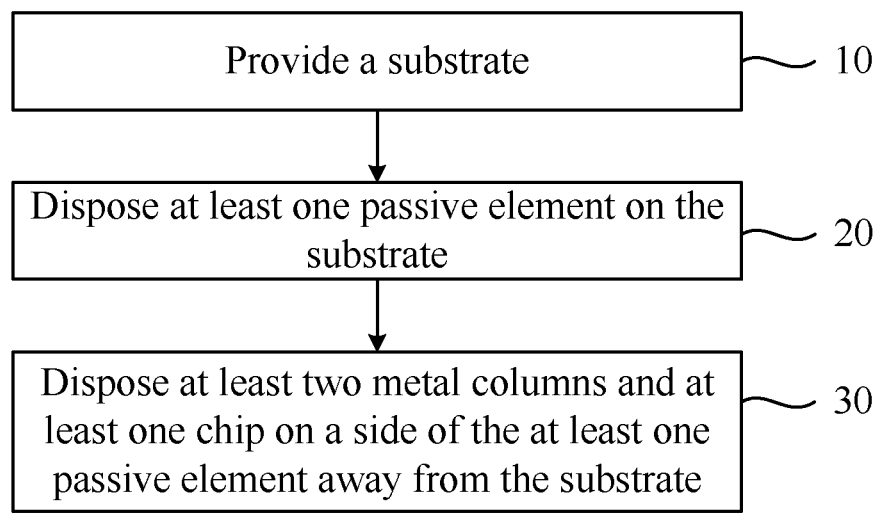
FIG. 5 is a flowchart of a method for manufacturing a module structure according to embodiment two.

FIG. 5 is a flowchart of a method for manufacturing a module structure according to embodiment two. Referring to FIG. 5, the method includes the steps described below.

In step 10, a substrate is provided.

In step 20, at least one passive element is disposed on the substrate.

In step 30, at least two metal columns and at least one chip are disposed on a side of the at least one passive element away from the substrate.

The vertical projection of the at least one chip on the substrate overlaps a line segment or closed figure formed by endpoints constituted by the vertical projections of the at least two metal columns on the substrate; and at least one of the following applies: the vertical projection of the at least one passive element on the substrate overlaps the line segment or closed figure formed by the endpoints constituted by the vertical projections of the at least two metal columns on the substrate; or the vertical projection of the at least one passive element on the substrate overlaps the vertical projection of the at least one chip on the substrate.

In the manufacturing process, the electrical connection among the at least one passive element, the at least two metal columns and the at least one chip is achieved according to the circuit actually required and the formed module structure can operate normally to achieve the particular functions of the formed module structure. The formed module structure may further include elements other than the at least one passive element, the at least two metal columns and the at least one chip so that the functions of the formed module structure can be perfected or increased.

In the module structure manufactured by the method provided by the embodiment of the present application, at least one passive element is disposed between a substrate and the film where at least one chip and at least two metal columns are located so that the at least one passive element and other elements are stacked three-dimensionally and not laid flat and thus the area of the module structure is reduced. Moreover, the at least one chip is disposed among the at least two metal columns in such manner that the at least one chip is nested among the at least two metal columns so that the space utilization of the module structure is improved and the high integration of the module structure is achieved.

Optionally, step 30 may include the steps described below.

A first dielectric layer is formed on aside of the substrate adjacent to the at least one passive element, the first dielectric layer covers or wraps the at least one passive element, a first via is formed in the first dielectric layer, and a first conductor is formed in the first via.

The at least two metal columns and the at least one chip are disposed on a side of the first dielectric layer away from the at least one passive element.

To guarantee that the at least one passive element is not located in the same film as the at least two metal columns and the at least one chip and the three-dimensional stack is achieved, the first dielectric layer may be formed, the first dielectric layer may achieve the electrical insulation between the at least one passive element and the at least two metal columns or between the at least one passive element and the at least one chip, and the cases such as the short circuit or leakage due to the unnecessary contact among multiple elements can be prevented from occurring.

In an embodiment, a first connection layer may be formed on the first dielectric layer so that the electrical connection among the elements covered by the first dielectric layer and other elements is achieved. For example, in the case where the first dielectric layer only covers the at least one passive element, the electrical connection of structures, such as between the at least one passive element, between the at least one passive element and the at least two metal columns, between the at least one passive element and the at least one chip or among the at least one passive element, the at least two metal columns and the at least one chip is achieved through the cooperation between the first conductor and the first connection layer. In view of the actual circuit condition, the first dielectric layer may further cover other elements, and then the first conductor and the first connection layer may achieve the electrical connection between this element and other elements.

Multiple elements in the module structure are connected through the first conductor and the first connection layer so that solder balls are prevented from occurring, the parasitic resistance in the module structure is reduced, the quality factor of the capacitor or the inductor is improved, and the performance of the module structure is optimized.

In an embodiment, a second dielectric layer may be formed after the at least two metal columns and the at least one chip are disposed. The surface of the second dielectric layer away from the substrate is flush with the surfaces of the at least two metal columns away from the substrate, or the surface of the second dielectric layer away from the substrate is lower than or higher than the surfaces of the at least two metal columns away from the substrate. A second via is formed in the second dielectric layer and a second conductor is formed in the second via. A second connection layer may be formed on the second dielectric layer and the second conductor cooperates with the first connection layer or the second connection layer so that the electrical connection among multiple elements can be achieved.

A third dielectric layer may be formed on aside of the second dielectric layer away from the substrate and the third dielectric layer covers the second dielectric layer. A third via may be formed in the third dielectric layer and the third via may achieve the electrical connection between the module structure and other structures (such as other module structures or chips). To reduce the parasitic resistance, a third conductor may be formed in the third via.

Embodiment Three

Embodiment three provides a module structure manufactured according to the method for manufacturing a module structure.

Figure 6:
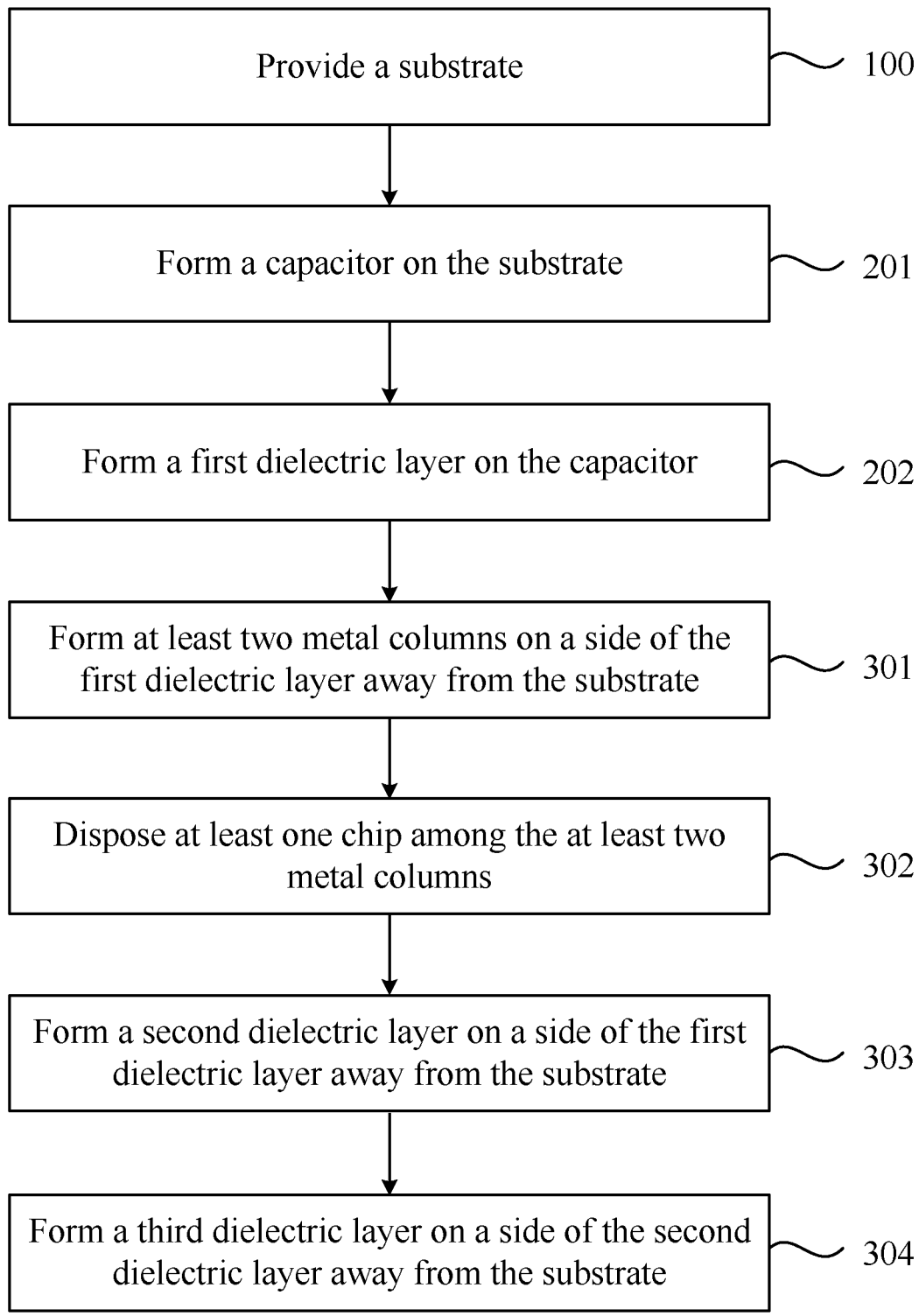
FIG. 6 is a flowchart of a method for manufacturing a module structure according to embodiment three.
Figure 7:
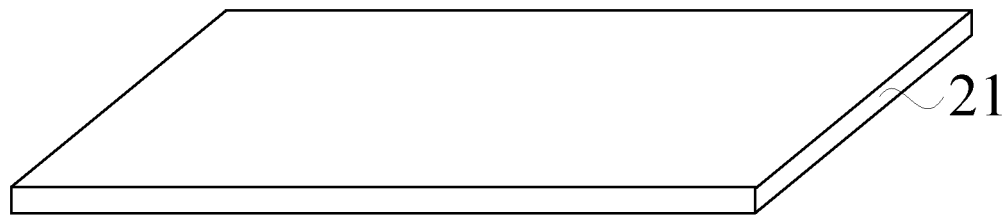
FIGS. 7 to 13 are structure diagrams of a module structure in multiple states when the module structure is manufactured by using the method for manufacturing a module structure provided in FIG. 6.

FIG. 6 is a flowchart of a method for manufacturing a module structure according to embodiment three. FIGS. 7 to 13 are structure diagrams of a module structure in multiple states when the module structure is manufactured by using the method for manufacturing a module structure provided in FIG. 6.

Exemplarily, the manufactured module structure includes a passive element, multiple metal columns, a chip and three dielectric layers, where the passive element is a capacitor, the chip includes three interfaces and all the three interfaces are disposed on the surface of the chip away from the substrate. The method for manufacturing this module structure may include the steps described below.

In step 100, a substrate is provided.

In step 201, a capacitor is formed on the substrate.

Figure 8:

Referring to FIG. 8, a metal-insulator-metal (MIM) capacitor 22 may be formed through the manner of etching and corrosion, and the capacitor 22 may be achieved through the manner of a thin film. Exemplarily, an electrode of the capacitor 22 may be formed on the substrate at first, then a dielectric layer of the capacitor 22 may be formed, and the capacitor may be formed through the manner of forming another electrode of the capacitor 22. The size of the electrodes of the capacitor 22 and the material of the dielectric layer of the capacitor 22 may be adjusted according to the actual requirements. For example, the area of the electrode at a side of the capacitor adjacent to a substrate layer is greater than the area of the electrode at a side of the capacitor away from the substrate layer, and the material of the dielectric layer of the capacitor 22 is silicon nitride.

In step 202, a first dielectric layer is formed on the capacitor.

Figure 9:
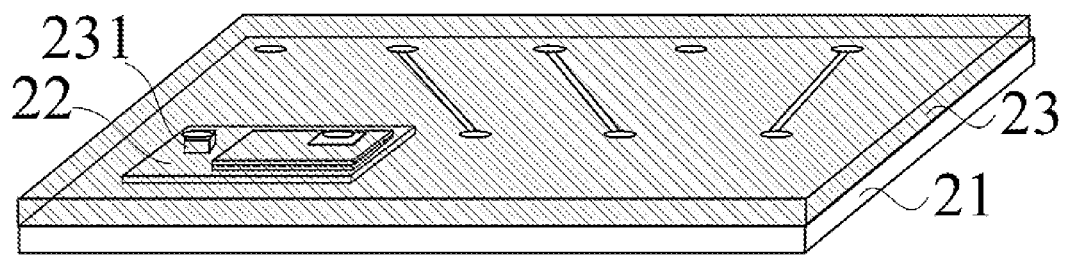

Referring to FIG. 9, the first dielectric layer 23 is formed on the substrate 21 and the capacitor 22 through the manner of deposition. A first via is formed on the first dielectric layer 23 through the manner of etching and corrosion. Through the manner such as rewiring, deposition, electroplating, or exposing and developing, a first conductive material 231 is formed in the formed first via and a first connection layer is formed on the first dielectric layer. The first conductive material 231 is electrically connected to the electrodes of the capacitor 22 so that the electrical connection between the capacitor 22 and other elements is achieved; the first connection layer is formed according to the requirements of the actual circuit and is used for achieving the electrical connection among the multiple elements in the module structure, and the first connection layer may include a first connection part connected to the at least two metal columns and may also include other wires used for achieving the electrical connection among other elements. The electrical connection among the multiple elements in the module structure is achieved by using the first connection layer and the first conductive material so that solder balls are prevented from using, the parasitic resistance in the module structure is reduced, and the performance of the module structure is optimized.

In step 301, at least two metal columns are formed on aside of the first dielectric layer away from the substrate.

Figure 10:
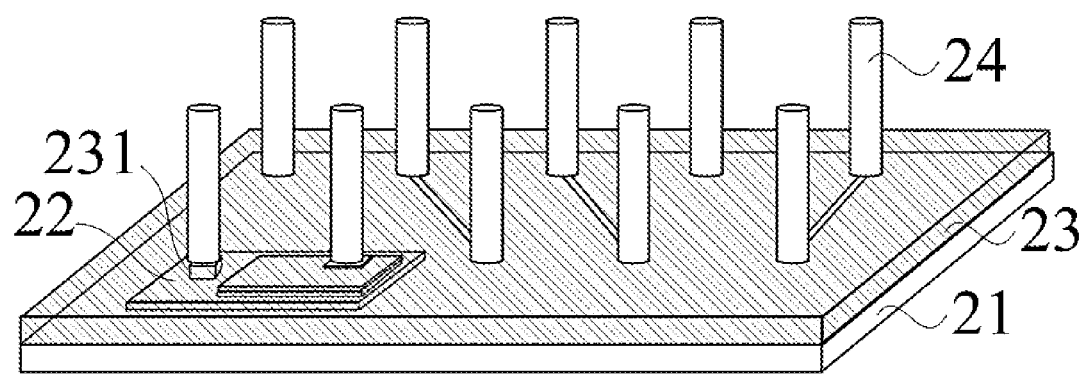

Referring to FIG. 10, the at least two metal columns 24 may be formed at the endpoints where the at least two metal columns 24 need to be formed in the first connection layer. There are multiple manners of forming the at least two metal columns 24. Exemplarily, the at least two metal columns 24 may be formed through the manner of electroplating.

In step 302, at least one chip is disposed among the at least two metal columns 24.

Figure 11:
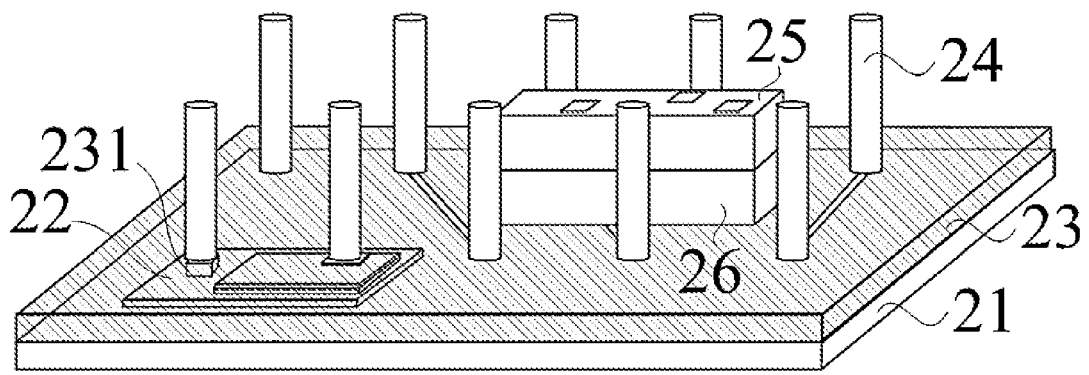

Referring to FIG. 11, the at least one chip 25 may be disposed among the at least two metal columns 24, that is, the vertical projection of the at least one chip 25 on the substrate 21 overlaps a line segment or closed figure formed by endpoints constituted by the vertical projections of at least two metal columns 24 on the substrate 21. Referring to FIG. 11, the at least one chip 25 is located in the area surrounded by the at least two metal columns 24 in such manner that the at least one chip 25 is nested among the at least two metal columns 24 so that the flat-laid area of the module structure is reduced and the space utilization of the module structure is improved.

The vertical projection of the capacitor 22 on the substrate 21 overlaps the line segment or closed figure formed by the endpoints constituted by the vertical projections of the at least two metal columns 24 on the substrate; or the vertical projection of the capacitor 22 on the substrate 21 overlaps the vertical projection of the at least one chip 25 on the substrate 21; or the vertical projection of the capacitor 22 on the substrate 21 overlaps the line segment or closed figure formed by the endpoints constituted by the vertical projections of the at least two metal columns 24 on the substrate 21 and overlaps the vertical projection of the at least one chip 25 on the substrate 21. The area surrounded by the at least one chip 25 and the at least two metal columns 24 overlaps the capacitor 22 in the vertical direction so that the three-dimensional stack of the elements in the module structure is achieved, the flat-laid area of the module structure is reduced, and the space utilization of the module structure is improved.

In view of the height difference existing between the at least one chip 25 and the at least two metal columns 24, a support layer 26 may be disposed below the at least one chip 25 before the at least one chip 25 is disposed so that the vertical distance between the interfaces in the at least one chip 25 and the end surfaces of the at least two metal columns 24 away from the substrate 21 is reduced.

In step 303, a second dielectric layer is formed on a side of the first dielectric layer away from the substrate.

Figure 12:
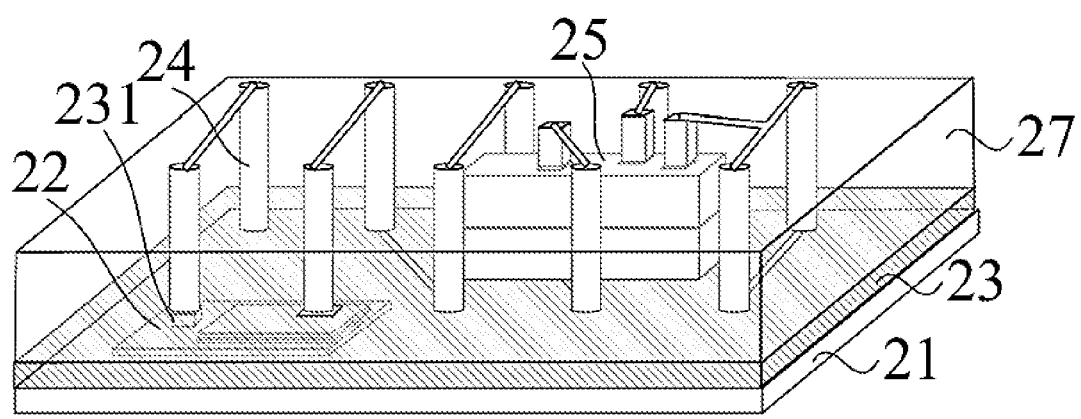

Referring to FIG. 12, the second dielectric layer 27 may be formed through the manner of deposition so that the second dielectric layer 27 covers the at least one chip 25 and the at least two metal columns 24 and the end surface of the second dielectric layer 27 away from the substrate 21 is flush with the end surfaces of the at least two metal columns 24 away from the substrate 21.

To facilitate the electrical connection between the at least two metal columns 24 and the at least one chip 25, a second via may be formed in the second dielectric layer 27, a second conductive material may be formed in the second via, and a second connection layer may be formed on the surface of the second dielectric layer away from the substrate 27. The second via may be disposed corresponding to the interface in the chip so that the electrical connection between the interface in the chip 25 and the second connection layer can be achieved by the second conductive material. The second connection layer may be electrically connected to the at least two metal columns 24. Through the mutual cooperation between the first conductive material, the second conductive material, the first connection layer and the second connection layer, the electrical connection among the elements in multiple films is achieved.

In step 304, a third dielectric layer is formed on a side of the second dielectric layer away from the substrate.

Figure 13:
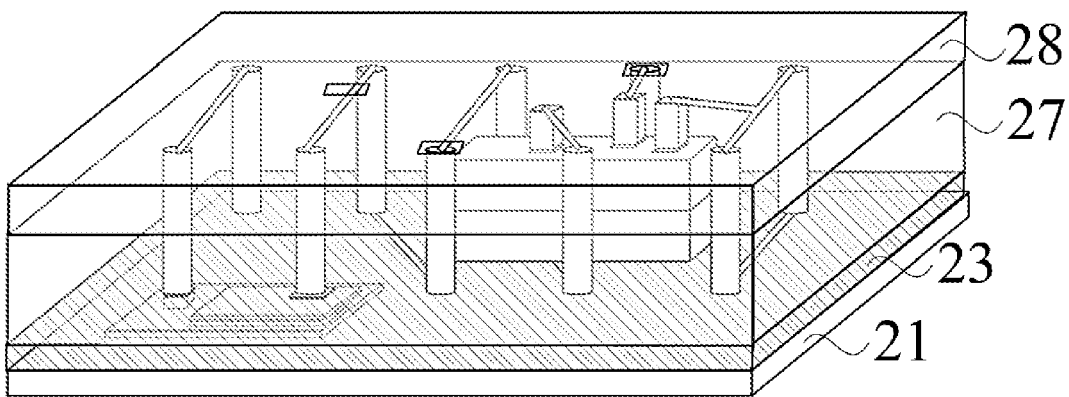

Referring to FIG. 13, the third dielectric layer 28 is used for preventing the short circuit and leakage among the elements in the module structure and other structures from occurring. A third via is formed in the third dielectric layer 28 so that the third via may be connected to other structures in subsequent processes.

In the module structure provided by embodiment three, at least one passive element is disposed between a substrate and the film where at least one chip and at least two metal columns are located so that the at least one passive element and other elements are stacked three-dimensionally and not laid flat and thus the area of the module structure is reduced. Moreover, the at least one chip is disposed among the at least two metal columns in such manner that the at least one chip is nested among the at least two metal columns so that the space utilization of the module structure is improved and the high integration of the module structure is achieved.

What is claimed is:

1. A module structure, comprising a substrate, at least one passive element, at least two metal columns and at least one chip, wherein
    the at least one passive element, the at least two metal columns and the at least one chip are located on a same side of the substrate, and the at least one passive element is located between the substrate and a film where the at least two metal columns are located and between the substrate and a film where the at least one chip is located;
    a vertical projection of the at least one chip on the substrate overlaps a line segment or closed figure formed by connecting endpoints constituted by vertical projections of the at least two metal columns on the substrate;
    at least one of the following applies: a vertical projection of the at least one passive element on the substrate overlaps the line segment or closed figure formed by connecting the endpoints constituted by the vertical projections of the at least two metal columns on the substrate; or a vertical projection of the at least one passive element on the substrate overlaps the vertical projection of the at least one chip on the substrate; and
    the module structure further comprises:
    a first dielectric layer, which covers or wraps the at least one passive element;
    a second dielectric layer, which is located on a side of the first dielectric layer away from the substrate;
    a third dielectric layer, which is located on a side of the second dielectric layer away from the substrate and covers the second dielectric layer;
    a first connection layer, which is located on the side of the first dielectric layer away from the substrate; and
    a second connection layer, which is located on the side of the second dielectric layer away from the substrate,
    wherein a first via is formed in the first dielectric layer, a first conductor is formed in the first via, and the at least one passive element is electrically connected to at least one of the at least two metal columns or the at least one chip through the first conductor and the first connection layer; and
    wherein a second via is formed in the second dielectric layer, a second conductor is formed in the second via, and the at least two metal columns are electrically connected to the at least one chip through the second conductor and the second connection layer.

2. The module structure of claim 1, wherein an individual metal column of the at least two metal columns forms an inductor, or at least part of the at least two metal columns are electrically connected to each other to form an inductor coil.

3. The module structure of claim 1, wherein the at least one passive element comprises at least one of a capacitor, a resistor or an inductor.

4. The module structure of claim 1, wherein each of the at least one chip comprises at least one interface, and each of the at least one interface is located on a surface of a respective chip adjacent to the substrate or a surface of a respective chip away from the substrate.

5. The module structure of claim 4, wherein in a case where each of the at least one interface is located on the surface of the respective chip away from the substrate, the module structure further comprises:
    a support layer, located between the respective chip and the substrate.

6. The module structure of claim 1, wherein a surface of the second dielectric layer away from the substrate is flush with surfaces of the at least two metal columns away from the substrate.

7. The module structure of claim 1, wherein a surface of the second dielectric layer away from the substrate is lower than or higher than surfaces of the at least two metal columns away from the substrate.

8. A method for manufacturing a module structure, comprising:
    providing a substrate;
    disposing at least one passive element on the substrate; and
    disposing at least two metal columns and at least one chip on a side of the at least one passive element away from the substrate;
    wherein a vertical projection of the at least one chip on the substrate overlaps a line segment or closed figure formed by connecting endpoints constituted by vertical projections of the at least two metal columns on the substrate;
    wherein at least one of the following applies: a vertical projection of the at least one passive element on the substrate overlaps the line segment or closed figure formed by connecting the endpoints constituted by the vertical projections of the at least two metal columns on the substrate; or a vertical projection of the at least one passive element on the substrate overlaps the vertical projection of the at least one chip on the substrate;
    wherein disposing the at least two metal columns and the at least one chip on the side of the at least one passive element away from the substrate comprises:
    forming a first dielectric layer on a side of the substrate adjacent to the at least one passive element, wherein the first dielectric layer covers or wraps the at least one passive element, a first via is formed in the first dielectric layer, and a first conductor is formed in the first via;
    forming a first connection layer on a side of the first dielectric layer away from the substrate; and disposing the at least two metal columns and the at least one chip on a side of the first dielectric layer away from the at least one passive element, wherein the at least one passive element is electrically connected to at least one of the at least two metal columns or the at least one chip through the first conductor and the first connection layer; and wherein the method further comprises:

forming a second dielectric layer on a side of the first dielectric layer away from the substrate;

forming a second connection layer on a side of the second dielectric layer away from the substrate, wherein a second via is formed in the second dielectric layer, a second conductor is formed in the second via, and the at least two metal columns are electrically connected to the at least one chip through the second conductor and the second connection layer; and forming a third dielectric layer on a side of the second dielectric layer away from the substrate, wherein the third dielectric layer covers the second dielectric layer.

* * * * *